(12) United States Patent
Dan et al.

(10) Patent No.: US 6,171,733 B1
(45) Date of Patent: Jan. 9, 2001

(54) MATERIAL FOR FORMING BLACK MATRIX FOR COLOR LIQUID CRYSTAL DISPLAY AND METHOD FOR FORMING BLACK MATRIX

(75) Inventors: Shigeyuki Dan; Nobuo Suzuki, both of Shizuoka; Taizo Mouri, Hyogo, all of (JP)

(73) Assignees: Fujifilm Olin Co., Ltd.; Fuji Photo Film Co., Ltd., both of Tokyo; Mikuni Color Ltd., Hyogo, all of (JP)

( * ) Notice: Under 35 U.S.C. 154(b), the term of this patent shall be extended for 0 days.

(21) Appl. No.: 09/359,393

(22) Filed: Jul. 23, 1999

(30) Foreign Application Priority Data

Jul. 24, 1998 (JP) .................................................. 10-209847

(51) Int. Cl.[7] .......................... G02B 5/20; G02F 1/1335; G03F 7/038
(52) U.S. Cl. ............................ 430/7; 430/270.1; 430/321
(58) Field of Search ........................... 430/7, 270.1, 325, 430/330, 321

(56) References Cited

U.S. PATENT DOCUMENTS

| 5,639,579 | * | 6/1997 | Hayashi et al. | 430/7 |
| 5,914,206 | * | 6/1999 | Takashi et al. | 430/7 |
| 5,925,484 | * | 7/1999 | Shima et al. | 430/7 |

FOREIGN PATENT DOCUMENTS 9-061615 * 3/1997 (JP) .
9-197115 * 7/1997 (JP) .

* cited by examiner

Primary Examiner—John A. McPherson
(74) Attorney, Agent, or Firm—Sughrue, Mion, Zinn, Macpeak & Seas, PLLC

(57) ABSTRACT

A material for forming a black matrix for a color liquid crystal display comprising:

(A) an alkali-soluble resin obtained by the condensation reaction of phenols containing at least cresol with aldehydes;

(B) an acid-crosslinkable methylolated melamine compound;

(C) a compound which absorbs a light and then generates an acid;

(D) a dispersant represented by formula (I):

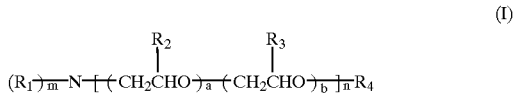

(I)

wherein $R_1$ represents a straight chain or branched alkyl group having from 1 to 24 carbon atoms, and this alkyl group may have a substituent; $R_2$ and $R_3$ each represents a hydrogen atom or a methyl group; $R_4$ represents a hydrogen atom, a straight chain or branched alkyl group having from 1 to 24 carbon atoms, —$COR_5$ or —$CONR_6$, and this alkyl group may have a substituent; $R_5$ and $R_6$ each represents an alkyl group having from 1 to 12 carbon atoms, an aryl group having from 6 to 12 carbon atoms, or an alkenyl group having from 6 to 32 carbon atoms; m represents 0, 1 or 2; n represents 1, 2 or 3; provided that m+n is 3; and a and b each represents a number of from 0 to 200, provided that a+b is from 2 to 200; and (E) a black pigment.

7 Claims, No Drawings

MATERIAL FOR FORMING BLACK MATRIX FOR COLOR LIQUID CRYSTAL DISPLAY AND METHOD FOR FORMING BLACK MATRIX

FIELD OF THE INVENTION

The present invention relates to a material for forming a black matrix for a color liquid crystal display and a method for forming a black matrix for a color liquid crystal display using the same.

BACKGROUND OF THE INVENTION

The color filter for a color liquid crystal display influences the displaying grade of the color liquid crystal display. Above all, it is essential that a black matrix for a color filter not only have sufficient light-shielding ability but also be formed with high resolution for achieving a high opening factor and high contrast.

Chromium-deposited films have so far been used in black matrices for a color filter. However, although black matrices comprising a chromium-deposited film are excellent in light-shielding ability, they have several problems that ghost image is caused as they have a high reflection coefficient leading to the deterioration of visibility, the color filter manufacturing process in which chromium is used in a black matrix is complicated and expensive, and the disposal of chromium waste solutions is problematic.

As has been the circumstances, black matrices comprising a photosensitive resin film having dispersed therein a black pigment and patterned upon a design have been developed. These black matrices have a low reflection coefficient and can be manufactured inexpensively. A radical polymerization type photosensitive resin is used as this photosensitive resin having dispersed therein a black pigment, but a radical polymerization type photosensitive resin is barely hardened in the range where a light reaches, therefore, hardening becomes insufficient in the vicinity of the interface between the film and the substrate. As a result, the development latitude becomes narrow.

Further, in conventional black pigments, even if a photosensitive resin composition is compounded by combining a black pigment with a quinonediazide compound, an alkali-insoluble substance is formed by merely blending, coating and drying the components, as a result, the image contrast is lowered or, in some cases, the composition comes to be substantially insoluble in a developing solution and patterning becomes impossible.

SUMMARY OF THE INVENTION

An object of the present invention is to provide a black matrix-forming material for a color liquid crystal display in which a hardening reaction proceeds sufficiently to the interface with the substrate even with a high concentration of a black pigment and which can provide wide development latitude.

A further object of the present invention is to provide a black matrix-forming material for a color liquid crystal display in which a hardening reaction does not proceed by merely blending, coating and drying the components constituting the black matrix-forming material, the solubility contrast of the exposed area and the unexposed area to the developing solution is sufficiently large, and from which a highly accurate black matrix can be produced.

Another object of the present invention is to provide a method for forming a black matrix for a color liquid crystal display of high concentration and high accuracy.

The above objects of the present invention have been attained by a black matrix-forming material for a color liquid crystal display and a method for forming a black matrix for a color liquid crystal display using the same as described in the following items (1) and (2).

(1) A material for forming a black matrix for a color liquid crystal display comprising:

(A) an alkali-soluble resin obtained by the condensation reaction of phenols containing at least cresol with aldehydes;

(B) an acid-crosslinkable methylolated melamine compound;

(C) a compound which absorbs a light and then generates an acid;

(D) a dispersant represented by formula (I):

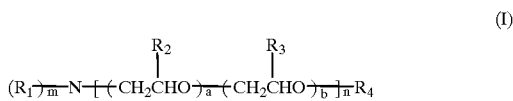

wherein $R_1$ represents a straight chain or branched alkyl group having from 1 to 24 carbon atoms, and this alkyl group may have a substituent; $R_2$ and $R_3$ each represents a hydrogen atom or a methyl group; $R_4$ represents a hydrogen atom, a straight chain or branched alkyl group having from 1 to 24 carbon atoms, —$COR_5$ or —$CONR_6$, and this alkyl group may have a substituent; $R_5$ and $R_6$ each represents an alkyl group having from 1 to 12 carbon atoms, an aryl group having from 6 to 12 carbon atoms, or an alkenyl group having from 6 to 32 carbon atoms; m represents 0, 1 or 2; n represents 1, 2 or 3, provided that m+n is 3; and a and b each represents a number of from 0 to 200, provided that a+b is from 2 to 200; and (E) a black pigment.

(2) A method for forming a black matrix for a color liquid crystal display which comprises coating the above black matrix-forming material for a color liquid crystal display on a transparent substrate, subjecting the film formed to exposure of the prescribed patterning, heat treating the film to effect crosslinking of the exposed area and distributing the acid generated by the exposure to the substrate, and then removing the unexposed area by alkali development.

DETAILED DESCRIPTION OF THE INVENTION

When the above-described black matrix-forming material having specific composition is coated on a substrate and the film formed is pattern-wise exposed, the component (C) present on the exposed area is thereby decomposed to generate an acid. By the succeeding heat treatment, the above generated acid crosslinks an acid-crosslinkable methylolated melamine compound, component (B), and makes it insoluble to an alkali developing solution, at the same time, the acid generated by the exposure diffuses to the substrate and also crosslinks and insolubilizes component (B) present near the substrate.

Thus in the present invention, even if a light is intercepted by a black pigment and does not reach the interface between the substrate and the film, component (B) is crosslinked far to the interface between the film and the substrate only by the exposure of the film surface and can be insolubilized to a developing solution. As a result, a black matrix containing a black pigment in high concentration can be formed.

Further, in black pigments so far been used, there have been such problems as an alkali-insoluble substance is formed by merely blending, coating and drying a black pigment with components (A), (B) and (C), and the composition becomes substantially developing solution-insoluble and patterning cannot be effected. However, the black matrix-forming material containing components (A), (B), (C), (D) and (E) in the present invention does not cause such problems.

In the first place, an alkali-soluble resin obtained by the condensation reaction of phenols containing at least cresol with aldehydes, which is component (A) of the black matrix-forming material for the color liquid crystal display according to the present invention, is described below.

In the present invention, as the above resin, resol resins or novolak resins obtained by the condensation reaction of phenols containing at least cresol with aldehydes are preferably used.

As alkali-soluble resins obtained by the condensation reaction of phenols containing at least cresol with aldehydes, resins obtained by the reaction of phenols containing 50 mol% or more of o-, m- or p-cresol with aldehydes are preferably used.

Examples of phenols which may be contained other than cresol include o-methoxyphenol, m-methoxyphenol, o-ethylphenol, m-ethylphenol, p-ethylphenol, 3,5-dimethoxyphenol, 2-methoxy-4-methylphenol, o-propoxyphenol, o-butoxyphenol, 3,4,5-trimethylphenol, o-vinylphenol, and m-phenylphenol.

Examples of aldehydes include formaldehyde, paraformaldehyde, acetaldehyde, propylaldehyde, benzaldehyde, phenylaldehyde, α-phenylpropylaldehyde, β-phenylpropylaldehyde, and o-hydroxybenzaldehyde. Among these, formaldehyde is preferred.

Resins obtained by the reaction of o-, m- or p-cresol or mixtures of them with formaldehyde are preferably used in the present invention.

These resins preferably have weight average molecular weight of from 500 to 20,000, and more preferably from 1,000 to 15,000.

The content of alkali-soluble resin component (A) in the black matrix-forming material according to the present invention is preferably from 35 to 90 wt %, more preferably from 45 to 75 wt %, based on the total solid content (by weight).

An acid-crosslinkable methylolated melamine compound, which is component (B) of the black matrix-forming material for the color liquid crystal display according to the present invention, is described below.

Specific examples of acid-crosslinkable methylolated melamine compounds include monomethylolmelamine, dimethylolmelamine, trimethylolmelamine, tetramethylolmelamine, pentamethylolmelamine, and hexamethylolmelamine, and hexamethylolmelamine is preferably used in the present invention.

The content of the acid-crosslinkable methylolated melamine compound, component (B), in the black matrix-forming material according to the present invention is preferably from 0.1 to 30 wt %, more preferably from 1 to 10 wt %, based on the total solid content (by weight).

A compound which absorbs a light and then generates an acid (a light-acid generating agent), which is component (C) of the black matrix-forming material for the color liquid crystal display according to the present invention, is described below. As a light-acid generating agent, generally known onium salts, quinonediazide compounds, or organic halides can be used.

More specifically, there can be exemplified as onium salts, e.g., diazonium salts, phosphonium salts and sulfonium salts having a fluoroborate anion, a trifluoromethanesulfonate anion, a paratoluenesulfonate anion, or a paranitrotoluenesulfonate anion as a counter ion.

As a quinonediazide compound, salts of naphthoquinonediazidosulfonyl chloride and naphthoquinonediazidosulfonic acid can be preferably used. Further, an organic halide means a compound which forms hydroacid halide, e.g., compounds disclosed in U.S. Pat. Nos. 351,552, 536,489, 3,779,778, and West German Patent Application (OLS) No. 2,243,621 can be exemplified. More specifically, those compounds disclosed in U.S. Pat. No. 351,552, e.g., carbon tetrabromide, tetra(bromomethyl)methane, tetrabromoethylene, 1,2,3,4-tetrabromobutane, trichloroethoxyethanol, p-iodophenol, p-bromophenol, p-iodobiphenyl, 2,6-dibromophenol, 1-bromo-2-naphthol, p-bromoaniline, hexachloro-p-xylene, trichloroacetanilide, p-bromodimethylaniline, tetrachlorotetrahydronaphthalene, a,a'-dibromoxylene, a,a,a,a'-tetrabromoxylene, hexabromoethane, 1-chloroanthraquinone, Ω, Ω, Ω-tribromoquinaldine, hexabromocyclohexane, 9-bromofluorene, bis(penta)chlorocyclopentadiphenyl, polyvinylidene chloride, and 2,4,6-trichlorophenoxyethyl vinyl ether, and those disclosed in U.S. Pat. No. 3,779,778, e.g., hexabromoethane, a,a,a-trichloroacetophenone, tribromotrichloroethane and halomethyl-s-triazines can be exemplified.

Of these, halomethyl-s-triazines, e.g., 2,4-bis-(trichloromethyl)-6-methyl-s-triazine and 2,4,6-tris-(trichloromethyl)-s-triazine are particularly preferred. As more preferred organic halides, compounds substituted with vinylhalomethyl-s-triazine disclosed in U.S. Patent 3,987,037 can be exemplified. This vinylhalomethyl-s-triazine compound is photolytic triazine having at least one trihalomethyl group and a group conjugated with a triazine ring by at least one ethylenically unsaturated bond, which is represented by the following formula (A):

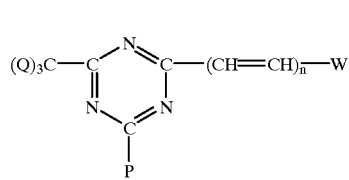

(A)

wherein P represents —C(Q)$_3$, —NH$_2$, —NHR, —N(R)$_2$, or —OR (wherein R represents a phenyl group or a lower alkyl group having 6 or less carbon atoms); Q represents bromine or chlorine; n represents an integer of from 1 to 3; and W represents an aromatic ring or a group represented by the following formula (B):

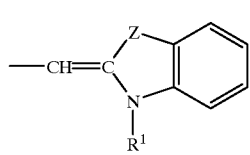

(B)

wherein Z represents oxygen or sulfur, and R$^1$ represents a lower alkyl group or a phenyl group.

In formula (A), the aromatic ring or the heterocyclic ring represented by W may further be substituted, and examples of the substituents include chlorine, bromine, a phenyl group, a lower alkyl group having 6 or less carbon atoms, nitro, phenoxy, alkoxyl, acetoxy, acetyl, amino and alkylamino groups.

These compounds can be used alone, or two or more of them can be used in combination.

The compounding amount of the light-acid generating agent, component (C), in the black matrix-forming material according to the present invention is preferably from 0.1 to 30 wt %, more preferably from 1 to 10 wt %, based on the total solid content (by weight).

A dispersant represented by formula (I), which is component (D) of the black matrix-forming material according to the present invention, is described below.

In formula (I), as the straight chain or branched alkyl group having from 1 to 24 carbon atoms represented by $R_1$ and $R_4$, a straight chain or branched alkyl group having from 1 to 24 carbon atoms such as $CH_3$—, $CH_3CH_2$—, $CH_3(CH_2)_2$—, $CH_3(CH_2)_3$—, $CH_3(CH_2)_4$—, $(CH_3)_2CH(CH_2)_2$—, $CH_3CH_2CH(CH_3)CH_2$—, $CH_3(CH_2)_2CH(CH_3)$—, $CH_3(CH_2)_7$—, $CH_3(CH_2)_8$—, $CH_3(CH_2)_{10}$—, $CH_3(CH_2)_{12}$—, $CH_3(CH_2)_{14}$—, $CH_3(CH_2)_{16}$—, $CH_3(CH_2)_{18}$—, $CH_3(CH_2)_{20}$—, $CH_3(CH_2)_{22}$—, or $CH_3(CH_2)_{23}$— is preferred. As the substituent of these alkyl groups, a halogen atom, e.g., a chlorine atom or a bromine atom can be exemplified.

As the alkyl group having from 1 to 12 carbon atoms represented by $R_5$ and $R_6$ (when $R_4$ represents —$COR_5$ or —$COR_6$), the above-described examples of the alkyl groups having from 1 to 12 carbon atoms can be exemplified. As the aryl group having from 6 to 12 carbon atoms which may be substituted represented by $R_5$ and $R_6$, examples thereof include a monocyclic or bicyclic aryl group e.g., phenyl,

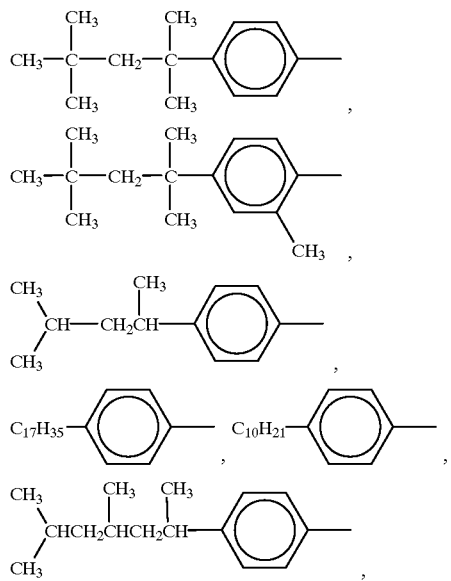

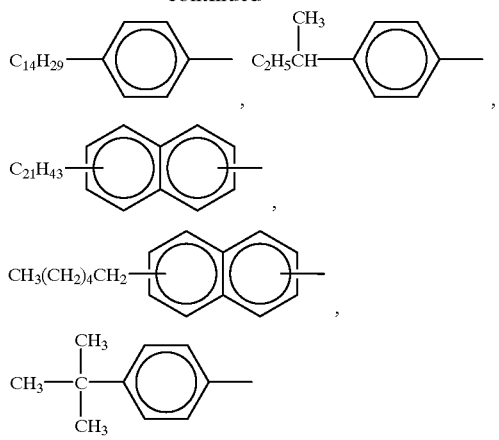

and those having a substituent of straight chain or branched alkyl group among these groups.

As the alkenyl group having from 6 to 32 carbon atoms represented by $R_5$ and $R_6$, the following can be exemplified:

$CH_2=CH(CH_2)_7$—, $CH_3CH_2CH=CH(CH_2)_7$—, $CH_3(CH_2)_5CH=CH$—, $CH_3(CH_2)_7CH=CH$—, $CH_3(CH_2)_5CH(OH)$ $CH_2CH_2CH=CH(CH_2)_7$—, $CH_3(CH_2)_{10}CH=CH(CH_2)_4$—, $CH_3(CH_2)_5CH=CH(CH_2)_9$—$CH_3(CH_2)_4CH=CHCH_2CH=CH(CH_2)_7$—, $CH_3CH_2CH=CHCH_2CH=CHCH_2CH=CH(CH_2)_7$—, $CH_3(CH_2)_3(CH=CH)_3(CH_2)_7$—, $CH_3(CH_2)_8(CH=CH)_3(CH_2)_4CO(CH_2)_2$— and $CH_3(CH_2)_9CH=CH(CH_2)_7$—.

In formula (I), $R_1$ preferably represents a straight chain or branched alkyl group having from 1 to 12 carbon atoms, $R_2$ preferably represents a hydrogen atom, $R_3$ preferably represents a methyl group, $R_4$ preferably represents a hydrogen atom or an alkyl group having from 1 to 8 carbon atoms, and a+b is preferably from 4 to 100, more preferably from 10 to 50.

A dispersant represented by formula (I) preferably has:

An acid value: from 0 to 5

An amine value: from 20 to 40

A molecular weight: from $1 \times 10^3$ to $1 \times 10^4$

The above dispersant has an acid value of from 0 to 5, preferably from 0 to 2; an amine value of from 20 to 40, preeferably from 25 to 35, and a molecular weight of from $1 \times 10^3$ to $1 \times 10^4$, preferably from $1 \times 10^3$ to $5 \times 10^3$.

Specific examples of the dispersants represented by formula (I) are shown below, but the present invention is not restricted thereto.

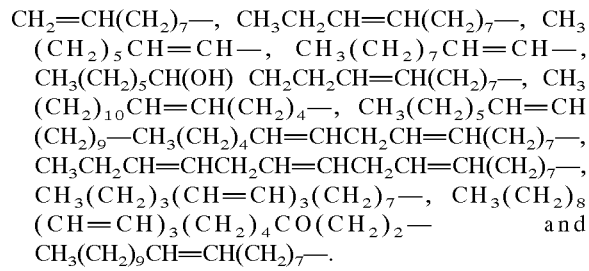

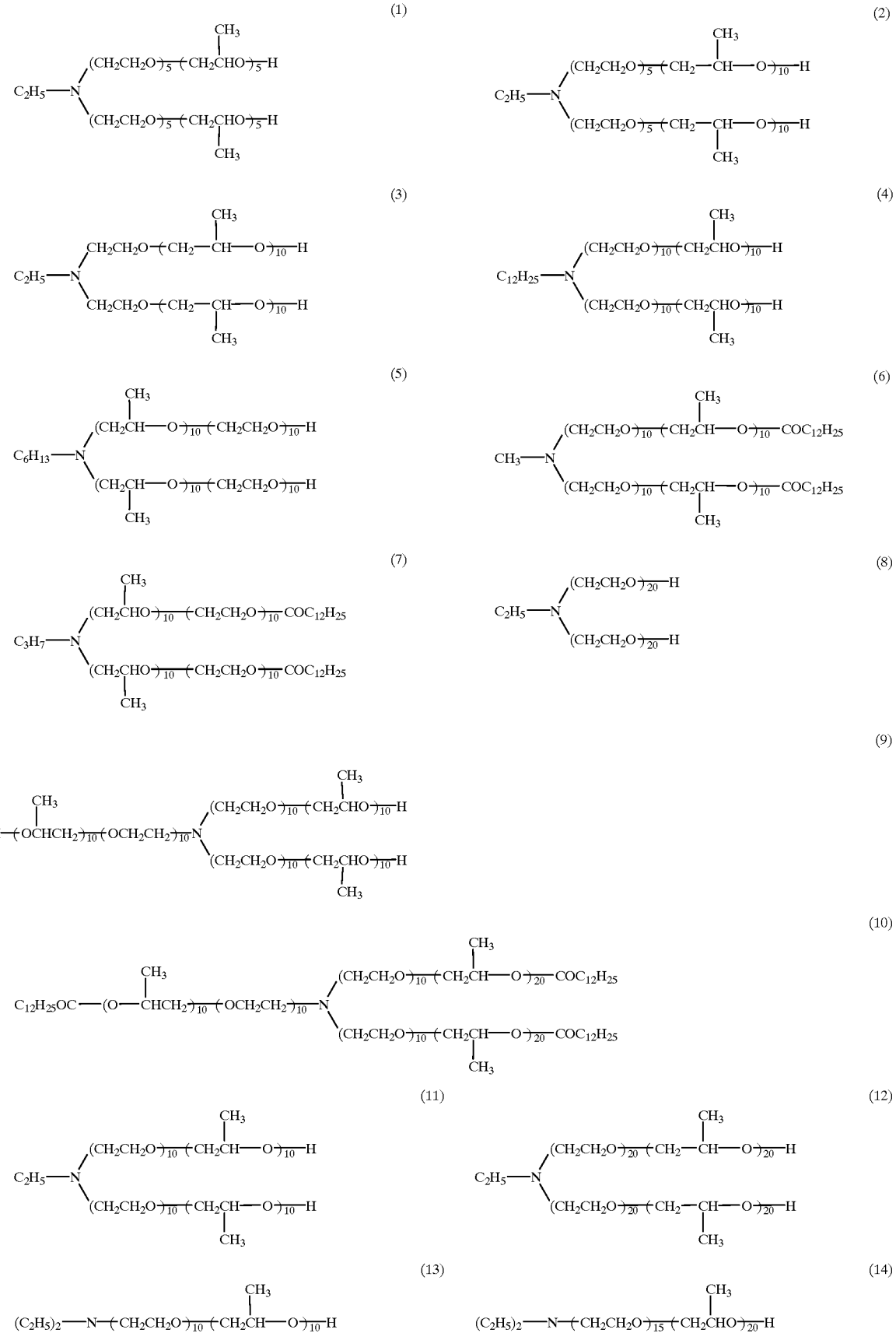

(15) 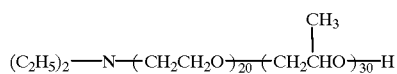
(16) 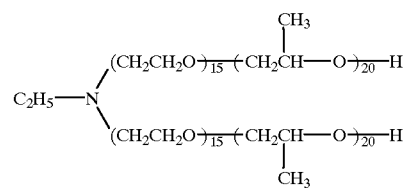
(17) 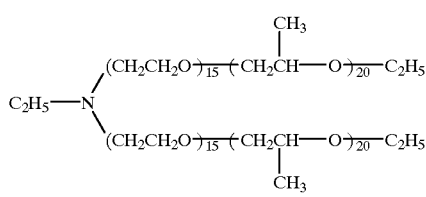
(18) 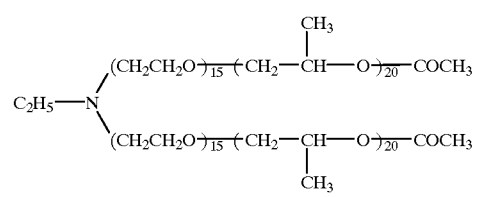
(19) 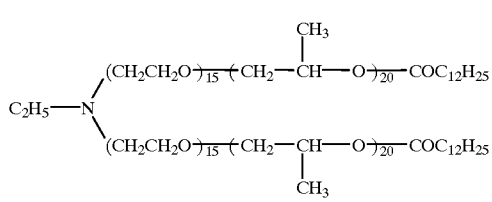
(20) 
(21) 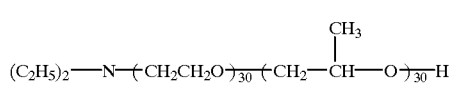
(22) 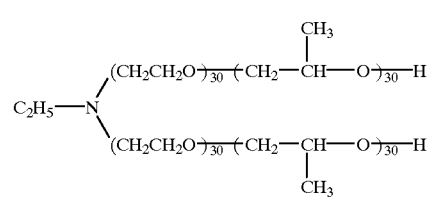
(23) 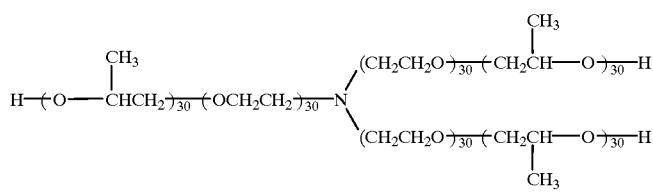
(24) 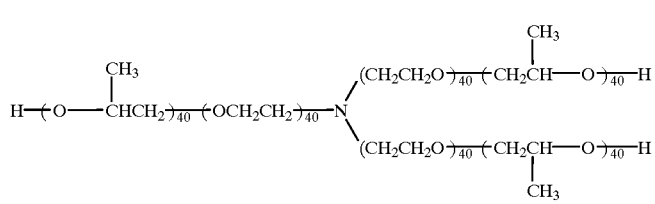
(25) 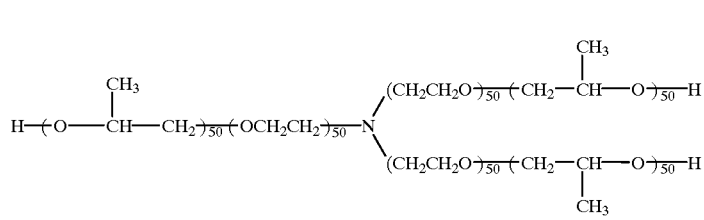

-continued

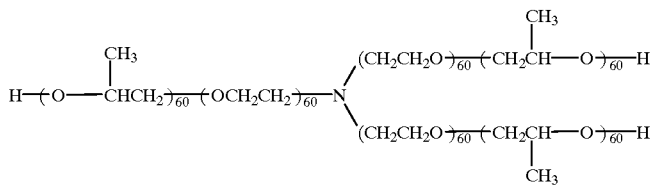
(26)

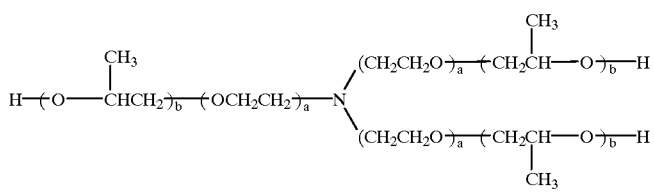
(27)

a + b = 150

The content of the dispersant represented by formula (I), component (D), in the black matrix-forming material according to the present invention is preferably from 0.01 to 70 wt %, more preferably from 0.4 to 40 wt %, based on the total weight of pigments.

The black pigment (E) for use in the present invention may be organic or inorganic.

Examples of preferred organic pigments include pigments having high heat resistance and high light fastness such as phthalocyanine pigments, e.g., Phthalocyanine Blue and Phthalocyanine Green; anthraquinone pigments, e.g., Chromophthal Red; azo or azo-lake pigments, e.g., Bordeaux 10B and Lake Red; isoindolinone pigments, e.g., Irgazine Yellow; dioxazine pigments, e.g., Dioxazine Violet; nitroso pigments, e.g., Naphthol Green B; nitro pigments; lake pigments, e.g., Peacock Blue Lake and Rhodamine Lake; quinacridone pigments; and quinacridine pigments.

Examples of preferred inorganic pigments include carbon black; metal oxide pigments, e.g., titanium oxide, iron oxide, zinc oxide and chromium oxide; sulfide pigments, e.g., zinc sulfide; and carbonate and silicate.

These pigments can be used alone or in combination of two or more, although it depends on the kind of the pigment.

In any case, for the purpose of preventing light scattering and ensuring flatness, the particle size of pigments is 0.4 μm or less, particularly preferably 0.2 μm or less.

Further, for increasing blackness, it is preferred to select the ratio of the amount of pigments used such that the transmittance throughout the visible light region is uniformly 5% or less and the transmittance in the vicinity of 550 nm which is the most sensitive region to the human eyes becomes minimum.

The content of the pigment in the black matrix-forming material according to the present invention is preferably from 10 to 70 wt %, particularly preferably from 20 to 50 wt %, based on the total solid content (by weight).

The black matrix-forming material for the color liquid crystal display according to the present invention may contain optional components other than (A), (B), (C), (D) and (E) components such as a silicone surfactant, a fluorine surfactant, a polyether surfactant, amines, etc., in the range not impairing the achievement of the objects of the present invention.

The preparing method of the black matrix-forming material according to the present invention will be described below, but the present invention is not limited thereto.

For obtaining the black matrix-forming material according to the present invention, pigments are generally dispersed with a pigment dispersant in wet dispersing system but the following means can be used, if necessary.

A black pigment is subjected to flashing process in the first place, and then kneaded with a resin by means of a kneader, an extruder, a ball mill or a double or triple roll mill.

As a preferred kneading method, a method of first blending a black pigment and a resin homogeneously with adding a solvent, then sufficiently kneading the pigment and the resin with heating, if necessary, using a two- or three-roll mill to obtain a homogeneous colored product can be applied.

Subsequently, the pigment and other constituting components including a dispersant are blended to effect wet dispersion (primary dispersion). The obtained dispersion solution is again subjected to wet dispersion (secondary dispersion) using finer beads until the pigment reaches the objective size distribution. Alternatively, the objective size and size distribution can be attained by separating the wet dispersed dispersion solution by centrifugation or removing coarse particles by decantation.

When the dispersant represented by formula (I) in the present invention is present in the above kneading and dispersing processes, atomization dispersion of the pigment is accelerated, which is advantageous to obtain the dispersion of a desired particle size distribution.

The thus-obtained colored dispersion is mixed with components (B) and (C) and offered for use as a photo-sensitive composition.

The black matrix for a color liquid crystal display can be formed from the black matrix-forming material of the present invention by the following procedure.

That is, the resist comprising the black matrix-forming material containing (A) an alkali-soluble resin, (B) an acid-crosslinkable methylolated melamine resin, (C) a light-acid generating agent, (D) a dispersant, (E) a black pigment, and optional components is coated on a transparent substrate, the solvent is dried by heating to form a black resist film. The black resist film is selectively exposed using a mask having a desired pattern. Upon exposure, component (C) is decomposed by the action of the light and generates an acid at the exposed area on the surface of the resist. This acid and component (B) react by heat treatment and component (B) is crosslinked, at the same time, the acid diffuses in the thickness direction of the black resist film and the crosslinking of component (B) further proceeds to the vicinity of the substrate, thereby a latent image is formed. After that, development processing is performed using an alkali developing solution to remove the unexposed area, as a result, a black resist pattern is selectively formed on the transparent substrate. By the subsequent post-baking, a black matrix is formed.

The film thickness of the above coated film is preferably from 0.5 to 5 μm, more preferably from 0.7 to 3 μm.

Ultraviolet rays, electron beams or X-rays are used for the above-described exposure light source.

The temperature for the above heat treatment is preferably from 80 to 180° C., more preferably from 100 to 160° C., and the heating time is preferably from 30 to 300 seconds, more preferably from 30 to 180 seconds.

Alkali developing solutions which are usually used in this field can be used as the alkali developing solution, e.g., inorganic alkalis such as potassium hydroxide, sodium hydroxide, potassium carbonate, sodium carbonate, potassium hydrogencarbonate, and sodium hydrogencarbonate, and amines such as triethanolamine, trimethylamine, triethylamine, pyridine, tetramethylammonium hydroxide, and tetraethylammonium hydroxide can be exemplified as such alkali developing solutions.

When the black matrix-forming material according to the present invention is used as a resist, an acid is generated upon exposure. After that, a crosslinking reaction occurs selectively by heat treatment on the area where an acid has been generated and, at the same time, and the acid further diffuses in the thickness direction of the resist to accelerate the hardening of the resist, thereby a black matrix having wide development latitude and high optical density can be formed.

EXAMPLE

The present invention will be described in detail below with referring to examples, but it should not be construed as the present invention is limited thereto.

Example 1

A solution having the following composition was prepared in the first place and the solution was stirred for 8 hours to obtain a photosensitive resin solution.

| | |
|---|---|
| Resol (*1) | 5 g |
| Hexamethylolmelamine | 0.5 g |
| 4-(o-Bromo-p-N-ethoxycarbonylmethylaminophenyl)-2,6-di(trichloromethyl)-s-triazine | 0.55 g |
| Carbon black dispersion solution A (*2) | 22 g |
| Ethyl cellosolve acetate | 40 g |

(*1): A resol resin comprising o-cresol, p-cresol and formaldehyde (o-cresol/p-cresol = 7/3, weight average molecular weight: 3,000)
(*2): A carbon black dispersion solution comprising a dispersant (the above-described Compound (13)) dispersed in isopropanol in a concentration of a solid content of 33%.

This photosensitive resin solution was coated on a substrate by means of a spin coater in a film thickness of 1.0 μm and heated at 100° C. for 60 seconds. The substrate was prepared by cutting borosilicate glass 7059 (manufactured by Corning Co.) having a thickness of 1.1 mm to 100 mm square and subjecting the square glass to ultrasonic cleaning using a 1%-sodium hydroxide aqueous solution.

The coated substrate was exposed through a mask having a line width of 20 μm (the dimension of the part to become a black matrix was 20 μm) using an exposer (manufactu red by Ushio Electric Co. Ltd.) at 200 Mj/cm².

The substrate was subjected to development consisting of heating at 130° C. for 60 seconds, immersing in a developing solution FHD-5 (manufactured by FUJIFILM OLIN Co., Ltd.), and then washing by high pressure spraying.

After the black matrix image obtained had been subjected to heat treatment at 220° C. for 30 minutes, the film thickness was 1.04 μm and optical density (OD) was 3.15. The image resolution was excellent, and development remaining, residue or the lack (i.e., the disappearance) of the image area were not generated.

Examples 2 to 4 and Comparative Example 1

Black matrix-forming materials were prepared in the same manner as in Example 1 except for replacing the dispersant used in Example 1 with those described in Table 1 below and evaluation was performed in the same manner as above. The film thickness and optical density of each sample obtained are shown in Table 1 below. Black matrix-forming materials in Examples 2 to 4 showed sufficient optical densities and excellent image resolution, and development remaining, residue or the lack of the image area were not generated.

Further, in Examples 1 to 4 and Comparative Example 1, development latitude (i.e., development tolerance) and image reproducibility were evaluated in the following manner. The results obtained are shown in Table 1.

Development latitude:
The case where the fluctuation of line width of 20 μm is within ±5% with the developing time of 30 seconds or more was graded o, and the case where the developing time was less than 30 seconds was graded x.

Development reproducibility:
The case where there was not observed roughness around the image of 20 μm line width was graded o, and the case where roughness was observed was graded x.

Example 5

A solution having the following composition was prepared and the solution was stirred for 8 hours to obtain a photosensitive resin solution in the same manner as in Example 1.

| | |
|---|---|
| Cresol novolak (*3) | 2.5 g |
| Hexamethylolmelamine | 0.3 g |
| 4-(o-Bromo-p-N-ethoxycarbonylmethylaminophenyl)-2,6-di(trichloromethyl)-s-triazine | 0.3 g |
| Carbon black dispersion solution (*4) | 13.5 g |
| Propylene glycol monomethyl ether acetate | 20 g |

(*3): A cresol novolak resin comprising m-cresol, p-cresol and formaldehyde (m-cresol/p-cresol = 6/4, weight average molecular weight: 5000)
(*4): A carbon black dispersion solution comprising a dispersant (the above-described Compound (1)) dispersed in isopropanol in a concentration of a solid content of 33%.

This photosensitive resin solution was coated on a glass substrate in a film thickness of 1.2 μm in the same procedure as in Example 1 and heated at 120° C. for 60 seconds.

The coated substrate was exposed through the same mask as used in Example 1 using an exposer (manufactured by Ushio Electric Co., Ltd.) at 200 mJ/cm².

The substrate was heated at 130° C. for 60 seconds, immersed in a developing solution FHD-5 (manufactured by FUJIFILM OLIN Co., Ltd.), and then washed by high pressure spraying.

After the image obtained had been subjected to heat treatment at 200° C. for 20 minutes, the film thickness was 1.17 μm and optical density (OD) was 3.35.

The image resolution was excellent similarly as in Example 1, and development remaining, residue and the lack of the image area were not generated.

Comparative Example 2

A black matrix-forming material was prepared in the same manner as in Example 5 except for replacing the dispersant used in Example 5 with a dispersant b shown below.

This solution was coated on a glass substrate in a film thickness of 1.1 μm in the same procedure as in Example 5 and subjected to heat treatment. The coated substrate was then exposed at 200 mJ/cm$^2$, heat treated at 120° C. for 60 seconds and development processed, but the coated film showed no change at all even the development was performed for 5 minutes, as a result, an image could not be obtained.

The results of evaluation of the optical densities, film thicknesses, development latitudes (i.e., development tolerance) and image reproducibilities in Example 5 and Comparative Example 2 are shown in Table 1 below.

TABLE 1

| Example No. | Dispersant | Optical Density/ Film Thickness | Development Latitude | Image Reproducibility |
|---|---|---|---|---|
| Example 1 | Dispersant (13) | 3.15/1.04 μm | ○ | ○ |
| Example 2 | Dispersant (13) | 3.08/1.03 μm | ○ | ○ |
| Example 3 | Dispersant (9) | 3.11/1.08 μm | ○ | ○ |
| Example 4 | Dispersant (3) | 3.0/1.0 μm | ○ | ○ |
| Comparative Example 1 | Dispersant a | 2.52/1.1 μm | x | x |
| Example 5 | Dispersant (1) | 3.35/1.17 μm | ○ | ○ |
| Comparative Example 2 | Dispersant b | 2.75/1.12 μm | x | x |

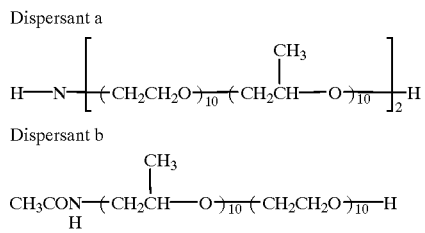

As is apparent from the results in Table 1, samples in Examples 1 to 5 show high optical density, excellent development latitude and excellent image reproducibility.

EFFECT OF THE INVENTION

The black matrix-forming material for a color liquid crystal display according to the present invention has the following characteristics:
1. A hardening reaction proceeds sufficiently to the interface with the substrate even a black pigment is used in a high concentration.
2. Development latitude is wide.
3. A hardening reaction does not proceed by mere blending, coating and drying of components, and the solubility contrast of the exposed area and the unexposed area to a developing solution is sufficiently large.

Therefore, a high concentration and highly accurate black matrix can be obtained from the black matrix-forming material according to the present invention.

While the invention has been described in detail and with reference to specific examples thereof, it will be apparent to one skilled in the art that various changes and modifications can be made therein without departing from the spirit and scope thereof.

What is claimed is:

1. A material for forming a black matrix for a color liquid crystal display comprising:
    (A) an alkali-soluble resin obtained by the condensation reaction of phenols containing at least cresol with aldehydes;
    (B) an acid-crosslinkable methylolated melamine compound;
    (C) a compound which absorbs a light and then generates an acid;
    (D) a dispersant represented by formula (I):

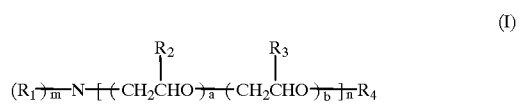

wherein $R_1$ represents a straight chain or branched alkyl group having from 1 to 24 carbon atoms, and this alkyl group may have a substituent; $R_2$ and $R_3$ each represents a hydrogen atom or a methyl group; $R_4$ represents a hydrogen atom, a straight chain or branched alkyl group having from 1 to 24 carbon atoms, —$COR_5$ or —$CONR_6$, and this alkyl group may have a substituent; $R_5$ and $R_6$ each represents an alkyl group having from 1 to 12 carbon atoms, an aryl group having from 6 to 12 carbon atoms, or an alkenyl group having from 6 to 32 carbon atoms; m represents 0, 1 or 2; n represents 1, 2 or 3, provided that m+n is 3; and a and b each represents a number of from 0 to 200, provided that a+b is from 2 to 200; and
    (E) a black pigment.

2. The material for forming a black matrix for a color liquid crystal display as claimed in claim 1, wherein said alkali-soluble resin is contained in a content of from 35 to 90 wt % based on the total solid content.

3. The material for forming a black matrix for a color liquid crystal display as claimed in claim 1, wherein said acid-crosslinkable methylolated melamine compound is contained in a content of from 0.1 to 30 wt % based on the total solid content.

4. The material for forming a black matrix for a color liquid crystal display as claimed in claim 1, wherein said compound which absorbs a light and then generates an acid is contained in an amount of from 0.1 to 30 wt % based on the total solid content.

5. The material for forming a black matrix for a color liquid crystal display as claimed in claim 1, wherein said dispersant represented by formula (I) is contained in a content of from 0.01 to 70 wt % based on the total weight of pigments.

6. The material for forming a black matrix for a color liquid crystal display as claimed in claim 1, wherein said black pigment is contained in a content of from 10 to 70 wt % based on the total solid content.

7. A method for forming a black matrix for a color liquid crystal display which comprises coating the following black matrix-forming material for a color liquid crystal display on a transparent substrate, subjecting the film formed to exposure of the prescribed patterning, heat treating the film to effect crosslinking of the exposed area and distributing the acid generated by the exposure to the substrate, and then removing the unexposed area by alkali development; and said black matrix-forming material for the color liquid crystal display comprising:

(A) an alkali-soluble resin obtained by the condensation reaction of phenols containing at least cresol with aldehydes;
(B) an acid-crosslinkable methylolated melamine compound;
(C) a compound which absorbs a light and then generates an acid;
(D) a dispersant represented by formula (I):

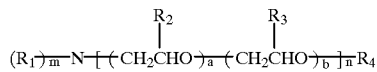
(I)

wherein $R_1$ represents a straight chain or branched alkyl group having from 1 to 24 carbon atoms, and this alkyl group may have a substituent; $R_2$ and $R_3$ each represents a hydrogen atom or a methyl group; $R_4$ represents a hydrogen atom, a straight chain or branched alkyl group having from 1 to 24 carbon atoms, —$COR_5$ or —$CONR_6$, and this alkyl group may have a substituent; $R_5$ and $R_6$ each represents an alkyl group having from 1 to 12 carbon atoms, an aryl group having from 6 to 12 carbon atoms, or an alkenyl group having from 6 to 32 carbon atoms; m represents 0,1 or 2; n represents 1, 2 or 3, provided that m+n is 3; and a and b each represents a number a+b is from 2 to 200; and (E) a black pigment.

* * * * *